(12) United States Patent
He

(10) Patent No.: US 9,089,081 B2
(45) Date of Patent: Jul. 21, 2015

(54) CONDUCTIVE GLASS SUBSTRATE AND PREPARATION METHOD THEREOF

(71) Applicant: NANCHANG O-FILM TECH. CO., LTD., Nanchang, Jiangxi (CN)

(72) Inventor: Zhao He, Nanchang (CN)

(73) Assignee: NANCHANG O-FILM TECH. CO., LTD., Nanchang, Jiangxi (CN)

( * ) Notice: Subject to any disclaimer, the term of this patent is extended or adjusted under 35 U.S.C. 154(b) by 47 days.

(21) Appl. No.: 14/000,194

(22) PCT Filed: Jul. 5, 2013

(86) PCT No.: PCT/CN2013/078891
§ 371 (c)(1),
(2) Date: Aug. 16, 2013

(87) PCT Pub. No.: WO2014/131259
PCT Pub. Date: Sep. 4, 2014

(65) Prior Publication Data
US 2014/0318836 A1 Oct. 30, 2014

(30) Foreign Application Priority Data
Mar. 1, 2013 (CN) .......................... 2013 1 0066646

(51) Int. Cl.
*B32B 3/00* (2006.01)
*H05K 3/46* (2006.01)
(Continued)

(52) U.S. Cl.
CPC .............. *H05K 3/465* (2013.01); *G02F 1/1333* (2013.01); *G06F 3/041* (2013.01); *H05K 1/0306* (2013.01); *H05K 1/09* (2013.01); *H05K 3/00* (2013.01); *G02F 1/1343* (2013.01)

(58) Field of Classification Search
USPC ............ 428/209, 210, 167, 428, 432; 501/26, 501/79
See application file for complete search history.

(56) References Cited

U.S. PATENT DOCUMENTS 4,070,517 A * 1/1978 Kazmierowicz .............. 428/209
4,270,823 A * 6/1981 Kuznetzoff ..................... 445/24
(Continued)

FOREIGN PATENT DOCUMENTS

| CN | 101497992A | A | 8/2009 |
| CN | 102722279A | A | 10/2012 |
| CN | 203225115 | U | 10/2013 |

OTHER PUBLICATIONS

Office action from corresponding Chinese Application No. 201310066646.5; dated Jan. 2, 2014; 5 pg.
(Continued)

*Primary Examiner* — Cathy Lam
(74) *Attorney, Agent, or Firm* — Haynes Beffel & Wolfeld LLP; James F. Hann

(57) ABSTRACT

A conductive glass substrate includes a glass substrate, a silicon dioxide layer, and a conductive mesh line, the glass substrate defines a meshed groove on a surface thereof; the silicon dioxide layer is attached to the surface of the glass substrate having the groove; the conductive mesh line have a shape adapted to that of the groove, the conductive mesh line is deposited in the groove and attached to the glass substrate via the silicon dioxide layer. In the conductive glass substrate, the conductive mesh line is received in the groove, compared with the conventional conductive glass substrate, a flexible substrate as a supporting body is not needed, the cost is down, and the structure of the conductive glass substrate is simple, further reducing the process, saving manpower and resources. A method of preparing the conductive glass substrate is provided.

3 Claims, 5 Drawing Sheets

(51) Int. Cl.
    *G02F 1/1333*     (2006.01)
    *G06F 3/041*     (2006.01)
    *H05K 1/03*     (2006.01)
    *H05K 1/09*     (2006.01)
    *H05K 3/00*     (2006.01)
    *G02F 1/1343*     (2006.01)

(56) References Cited

U.S. PATENT DOCUMENTS

| | | | | |
|---|---|---|---|---|
| 4,508,753 A | * | 4/1985 | Stepan | 427/555 |
| 5,062,891 A | * | 11/1991 | Gruber et al. | 524/296 |
| 5,468,695 A | * | 11/1995 | Carroll et al. | 501/79 |
| 5,637,261 A | * | 6/1997 | Mattox | 252/514 |
| 6,953,600 B2 | * | 10/2005 | Yokoyama et al. | 427/123 |
| 6,988,925 B2 | * | 1/2006 | Arthur et al. | 445/46 |
| 8,068,186 B2 | * | 11/2011 | Aufderheide et al. | 349/12 |
| 8,125,878 B2 | * | 2/2012 | Jiang et al. | 369/173 |
| 8,363,201 B2 | * | 1/2013 | O'Rourke et al. | 349/158 |
| 8,460,747 B2 | * | 6/2013 | Veerasamy | 427/122 |
| 8,513,878 B2 | * | 8/2013 | Tokunaga et al. | 313/505 |
| 8,550,991 B2 | * | 10/2013 | Nam | 600/202 |
| 8,593,055 B2 | * | 11/2013 | Tchakarov et al. | 313/503 |
| 8,648,525 B2 | * | 2/2014 | Chiba et al. | 313/503 |
| 8,661,662 B1 | * | 3/2014 | Cok | 29/846 |
| 2003/0108664 A1 | * | 6/2003 | Kodas et al. | 427/125 |
| 2014/0196781 A1 | * | 7/2014 | Ito et al. | 136/256 |

OTHER PUBLICATIONS

Office action from corresponding Chinese Application No. 201310066646.5; dated Oct. 10, 2014; 4 pgs.

* cited by examiner

CONDUCTIVE GLASS SUBSTRATE AND PREPARATION METHOD THEREOF

FIELD OF THE INVENTION

The present invention relates to glass substrate technologies, and more particularly relates to a conductive glass substrate and a preparation method thereof.

BACKGROUND OF THE INVENTION

The touch screen is more and more favored by people due to the advantage of "what you touch is what you get", besides other advantages of sturdy and durable, fast response and saving space. Currently, the conductive pattern or mesh is formed on the glass substrate to form the conductive glass substrate which has been widely applied to the field of various electronic products, especially in the field of the touch screen.

The conductive pattern or mesh is made a material of conductive metal and indium tin oxide (ITO). The ITO is used to form the conductive pattern, while the conductive mesh is made of conductive metal. In the conventional method of preparing the conductive glass substrate, in order to form the conductive mesh on the conductive glass substrate, the conductive mesh formed in a flexible substrate is firstly needed, and then the flexible substrate and the glass substrate are bonded, and finally the conductive glass substrate is formed. A lot of flexible substrates are used in the method of preparing the conductive glass substrate above, and the process is complicated, the molding process and other processes are needed, a lot of manpower and resources are also needed, so it is costly.

SUMMARY OF THE INVENTION

One object of the present invention is to provide a low-cost conductive glass substrate.

A conductive glass substrate includes:

a glass substrate, which defines a meshed groove on a surface thereof a silicon dioxide layer attached to the surface of the glass substrate defining the groove;

a conductive mesh line, which is adapted to the shape of the groove, the conductive mesh line being deposited in the groove, and attached to the glass substrate via the silicon dioxide layer.

In one embodiment, the conductive mesh line is made of at least one material selected from the group consisting of metal, conductive polymer, graphene, carbon nanotubes, and indium tin oxide.

In one embodiment, the material of the conductive mesh line further comprises glass powder.

In the conductive glass substrate, the conductive mesh line is deposited in the groove directly, compared with the conventional conductive glass substrate, a flexible substrate as a supporting body is not needed, the cost is down, and the structure of the conductive glass substrate is simple, further reducing the process, saving manpower and resources.

A method of preparing a conductive glass substrate includes the following steps:

providing a glass substrate, the glass substrate defining a meshed groove on a surface thereof;

coating a layer of silicon dioxide on the surface of the glass substrate defining the groove;

printing a conductive ink on the surface of the glass substrate having a silicon dioxide layer, the conductive ink being received in the groove; and curing the conductive ink to form a conductive mesh line on the surface of the glass substrate, then obtaining the conductive glass substrate.

In one embodiment, the conductive ink includes at least one particle selected from the group consisting of metal particle, conductive polymer particle, graphene particle, carbon nanotubes, and indium tin oxide particle.

In one embodiment, the conductive ink further includes glass powder.

In one embodiment, the glass substrate is made by the following steps:

providing a raw glass substrate, a surface of the raw glass substrate is flat;

coating a photoresist on the surface of the raw glass substrate, the photoresist forms an etching protective layer on the surface of the raw glass substrate;

exposing and developing the etching protective layer to remove the etching protective layer on the surface of the raw glass substrate where the groove are defined;

etching the surface of the raw glass substrate by using an etchant to form the groove on the surface of the raw glass substrate; and washing and removing the etching protective layer to obtain the glass substrate defining the groove on the surface thereof In one embodiment, the etchant is a hydrofluoric acid solution.

In one embodiment, the glass substrate is made by the following steps:

providing a mold with an injection chamber, an inner surface of the injection chamber defines a groove, the mold defines an injection port on a sidewall thereof, the injection port and the injection chamber are communicated; and injecting a molten glass to the injection chamber via the injection port, and cooling to obtain the glass substrate.

In one embodiment, the mold includes an upper mold core, a lower mold core and an annular cavity wall, the upper mold core and the lower mold core are located on two side of the annular cavity wall, respectively, such that the upper mold core, the lower mold core and the annular cavity wall cooperatively form the injection chamber.

In one embodiment, the glass substrate is made of at least one material selected from the group consisting of inorganic silicates, polycarbonate, and polymethylmethacrylate.

In the method of preparing the conductive glass substrate, the process is relatively simple, thus saving manpower and resources, reducing production cost. Besides, it is not necessary to use a flexible substrate as a supporting body for the conductive glass substrate prepared by the method, the cost is further reduced.

DETAILED DESCRIPTION OF THE EMBODIMENTS

Illustrative embodiments of the invention are described below. The following explanation provides specific details for a thorough understanding of and enabling description for these embodiments. One skilled in the art will understand that the invention can be practiced without such details. In other instances, well-known structures and functions have not been shown or described in detail to avoid unnecessarily obscuring the description of the embodiments.

Unless the context clearly requires otherwise, throughout the description and the claims, the words "comprise," "comprising," and the like are to be construed in an inclusive sense as opposed to an exclusive or exhaustive sense; that is to say, in the sense of "including, but not limited to." Words using the singular or plural number also include the plural or singular number respectively. Additionally, the words "herein," "above," "below" and words of similar import, when used in this application, shall refer to this application as a whole and not to any particular portions of this application. When the claims use the word "or" in reference to a list of two or more items, that word covers all of the following interpretations of the word: any of the items in the list, all of the items in the list and any combination of the items in the list.

Figure 1:
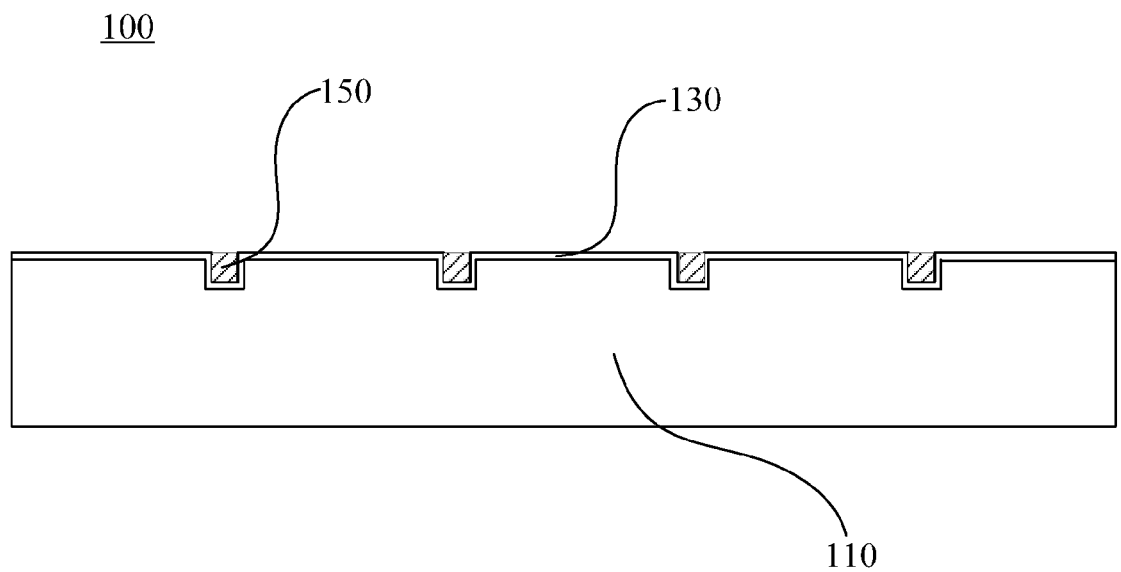
FIG. 1 is a schematic, cross-sectional view of an embodiment of a conductive glass substrate.

Referring to FIG. 1, an embodiment of a conductive glass substrate 100 includes a glass substrate 110, a silicon dioxide layer 130, and a conductive mesh line 150.

Figure 2:
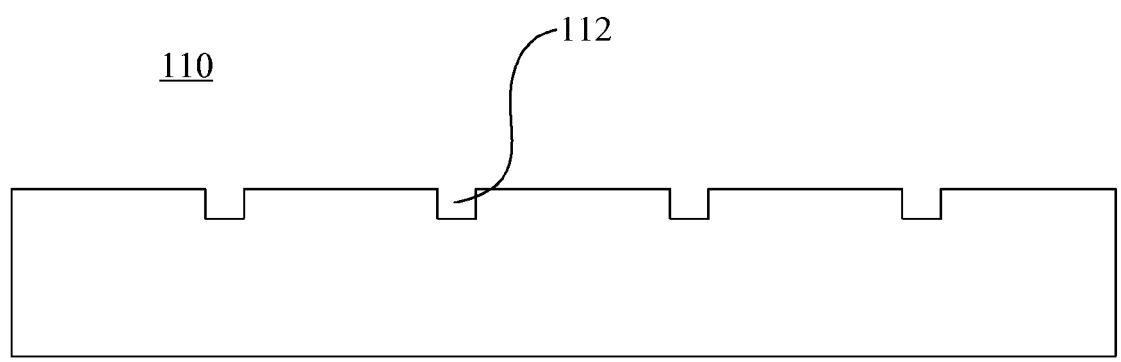
FIG. 2 is a schematic, cross-sectional view of a glass substrate of the conductive glass substrate shown in FIG. 1.

Referring to FIG. 2, a meshed groove 112 is defined on a surface of the glass substrate. The glass substrate 110 can be an inorganic silicate glass, it can also be an organic glass made of polycarbonate or polymethylmethacrylate, and so on.

The silicon dioxide layer 130 is attached to the surface of the glass substrate 110 defining the groove 112. The shape of the conductive mesh line 150 is adapted to that of the groove 112. The conductive mesh line 150 is deposited in the groove 112 and attached to the glass substrate 110 via the silicon dioxide layer 130. The silicon dioxide layer 130 can increase the adhesive force between the conductive mesh line 150 and the glass substrate 110, which ensures that the conductive mesh line 150 is not easily fallen from the glass substrate 110.

The conductive mesh line 150 is made of at least one material selected from the group consisting of metal, conductive polymer, graphene, carbon nanotubes, and indium tin oxide. In the illustrated embodiment, the conductive mesh line 150 is made of silver. Besides, the material of the conductive mesh line 150 further includes glass powder to increase the adhesive force between the conductive mesh line 150 and the glass substrate 110.

In the conductive glass substrate 100, the conductive mesh line 150 is deposited in the groove 112 of the glass substrate 100 directly, compared with the conventional conductive glass substrate, it is not necessary to use a flexible substrate as a supporting body for the conductive glass substrate 100 prepared by the method, the cost is further reduced. Besides, the structure of the conductive glass substrate 100 is simple, thus further reducing the process, saving manpower and resources.

Figure 3:
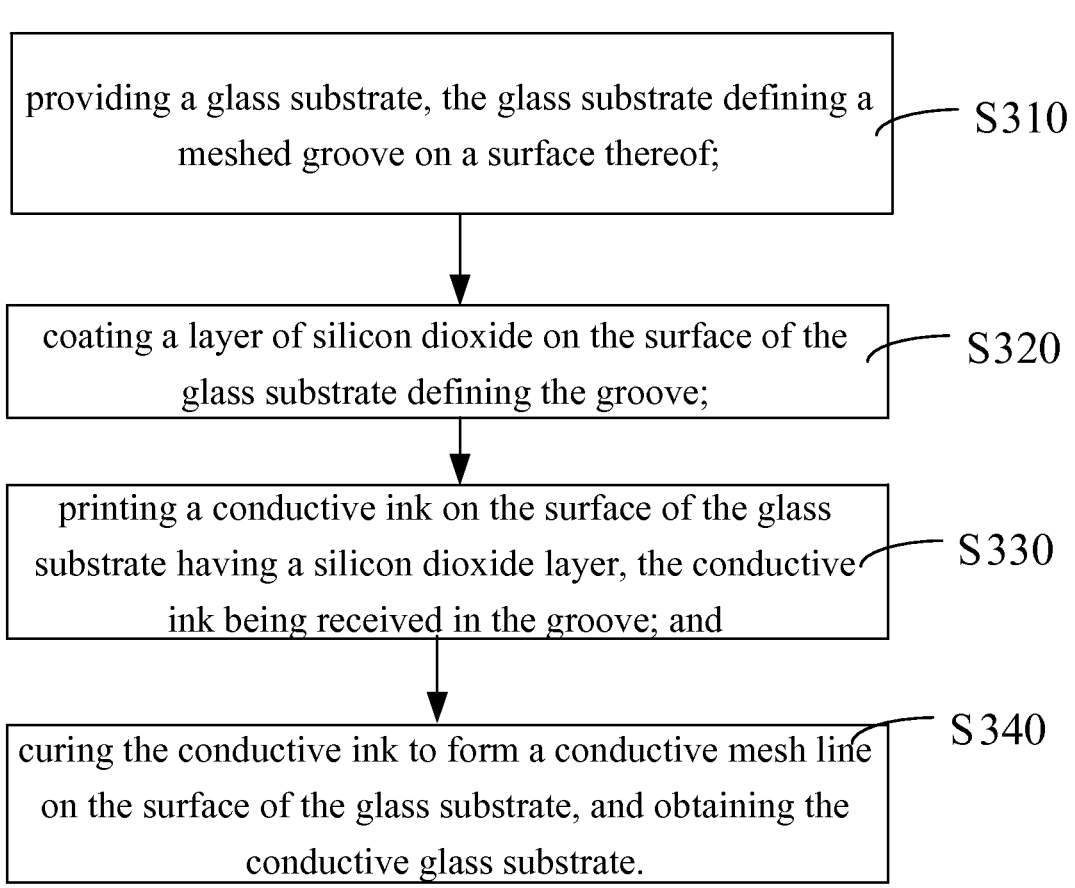
FIG. 3 is a flowchart of an embodiment of a method of preparing a conductive glass substrate.

Referring to FIG. 3, an embodiment of a method for preparing the conductive glass substrate 100 includes the following steps:

Step S310, a glass substrate is provided, the glass substrate defines a groove on a surface thereof, the groove is meshed.

Figure 4:
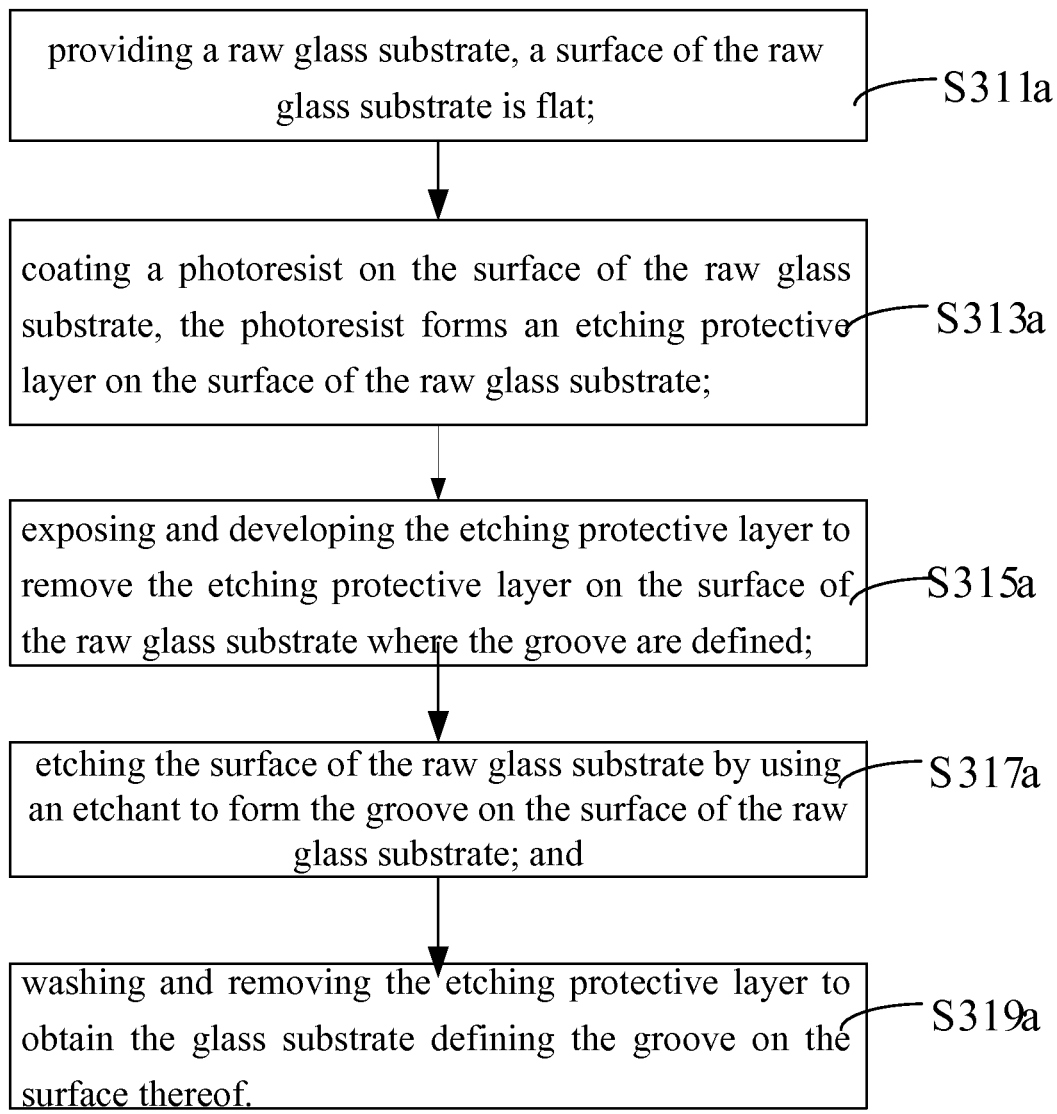
FIG. 4 is a flowchart of a method of preparing the glass substrate shown in FIG. 3.
Figure 5:
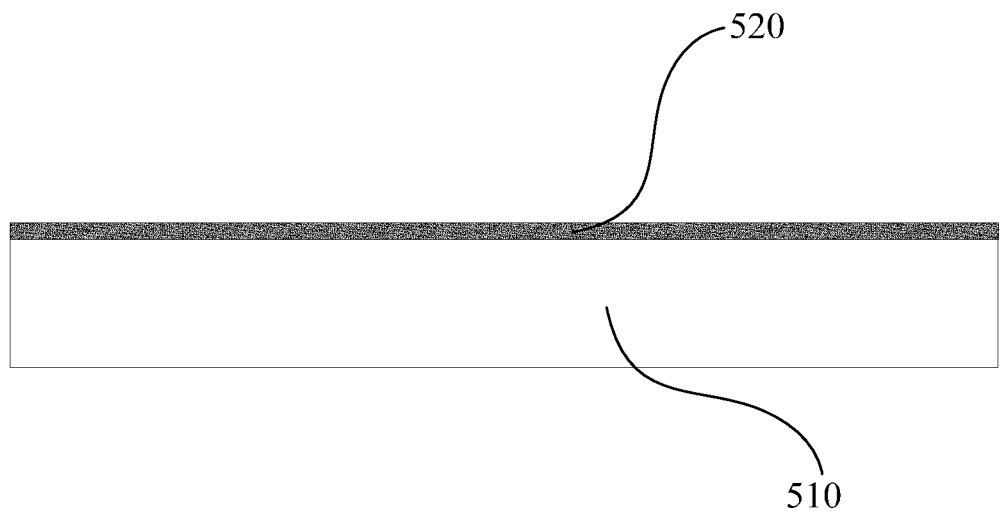
FIG. 5 shows a process sequence of a method of preparing the glass substrate shown in FIG. 3.

The glass substrate 110 defines a groove 112 on a surface thereof, the groove 112 is meshed. Referring to FIG. 4, specifically, the glass substrate 110 can be prepared by the following steps:

Step S311a, a raw glass substrate is provided, a surface of the raw glass substrate is flat. Referring to FIG. 5, a raw glass substrate 510 is provided, a surface of the raw glass substrate 510 is flat.

Step S313a, a photoresist is coated on the surface of the raw glass substrate, the photoresist forms an etching protective layer on the surface of the raw glass substrate. After the raw glass substrate 510 is cleaned, a photoresist is coated on the surface of the raw glass substrate 510, the photoresist forms an etching protective layer 520 on the surface of the raw glass substrate 510.

Figure 6:
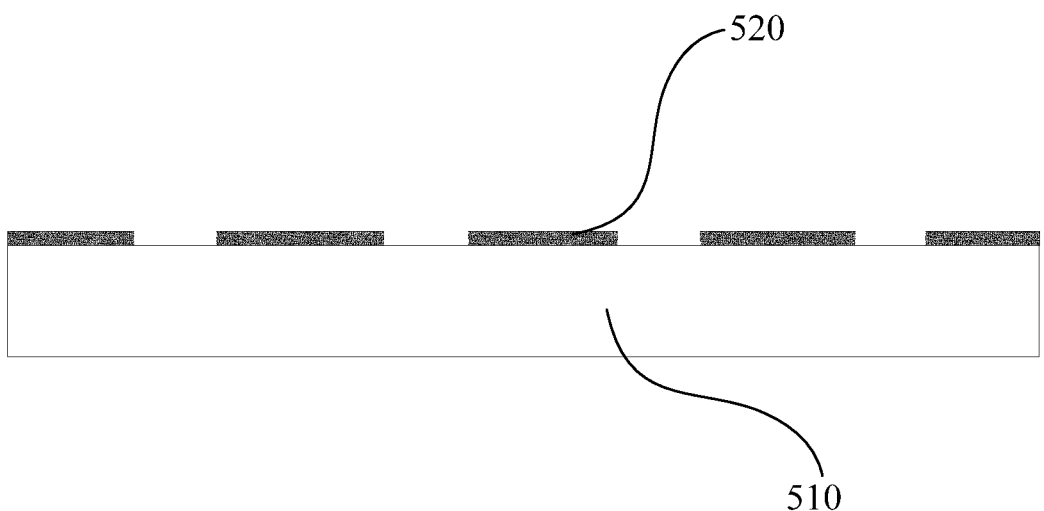
FIG. 6 shows another embodiment of a process sequence of a method of preparing the glass substrate shown in FIG. 3.

Step S315a, the etching protective layer is exposed and developed to remove the etching protective layer on the surface of the raw glass substrate where the groove is defined. Referring to FIG. 6, the etching protective layer 520 is exposed via a mask plate, and then developing in the developing solution. After developing, the etching protective layer 520 on the surface of the raw glass substrate 510 where the groove 112 is to be defined is removed.

The photoresist can have a chemical reaction under the ultraviolet irradiation. Specifically, under the ultraviolet irradiation, the macromolecules inside of the material which are insoluble in the developer decompose into micromolecules which are soluble in the developer. The mask plate is provided with a window which is consistent with the meshed groove 112 as needed. The ultraviolet light irradiates to the etching protective layer 520 formed by photoresist through the mask plate, part of the etching protective layer 520 is decomposed and dissolved in the developer, thus the etching protective layer 520 where the groove 112 is defined is removed.

It should be understood that, in alternative embodiments, the photoresist can also be cured under the ultraviolet irradiation and which is insoluble in developer, while the part of the uncured photoresist is soluble in developer. The window defined on the mask plate is consistent with the part of the raw glass substrate 510 without the groove. The ultraviolet light irradiates to the etching protective layer 520 formed of photoresist through the mask plate, thus part of the etching protective layer 520 is cured, and the part of the uncured photoresist is soluble in developer, thus the etching protective layer 520 where the groove 112 is needed to define is removed.

Step S317a, the surface of the raw glass substrate is etched by using an etchant to form the groove on the surface of the raw glass substrate. The etchant can be sprayed on the raw glass substrate 510, because the etching protective layer 520 where the groove 112 is needed to define have been removed, the meshed groove 112 can be formed on the surface of the raw glass substrate 510 by using the etchant. Since the region of the raw glass substrate 510 without defining the groove 112 is protected by the etching protective layer 520, it can not react with the etchant.

In the illustrated embodiment, the glass substrate 110 is made of at least one material selected from the group consisting of inorganic silicate, polycarbonate, and polymethylmethacrylate. The etchant is a hydrofluoric acid solution. It should be understood that the etchant can be other solutions, as long as they can react with the glass substrate 110 and a desired pattern or mesh can be formed on the surface of the glass substrate 110 by etching.

Step S319a, the etching protective layer is washed to obtain the glass substrate defining the groove on the surface thereof.

Figure 7:
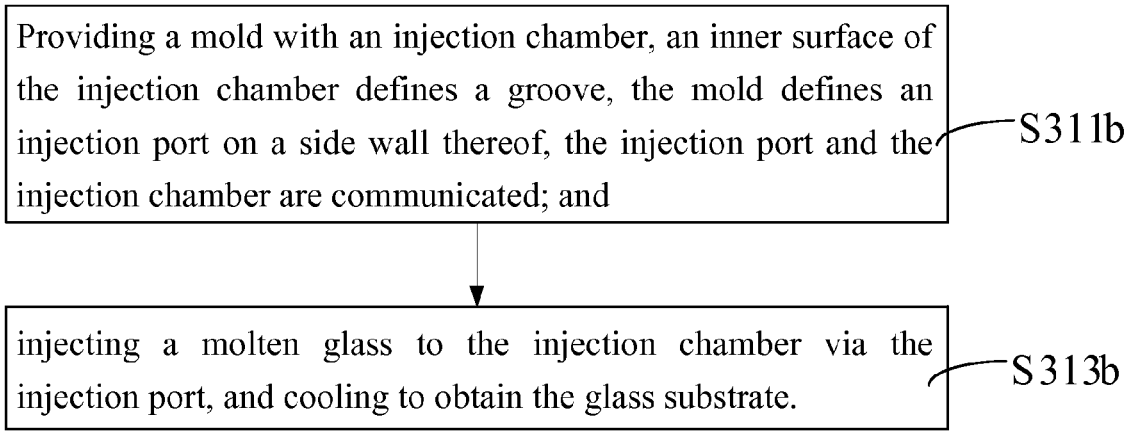
FIG. 7 is flowchart of another embodiment of a method of preparing the glass substrate shown in FIG. 3.
Figure 8:
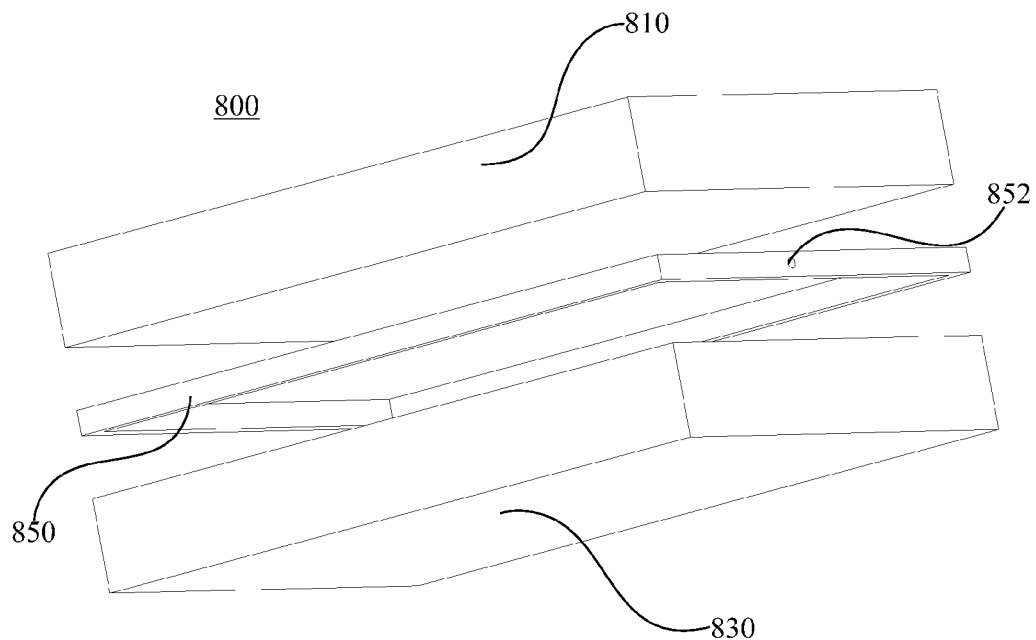
FIG. 8 is a schematic, perspective view of a mold for preparing the glass substrate.

The etching protective layer 520 is washed to obtain the glass substrate 110 defining the meshed groove 112 on the surface thereof It should be noted that, referring to FIG. 7, in alternative embodiments, the glass substrate 110 can be prepared by the following steps:

S311b, a mold is provided, the mold has an injection chamber, an inner surface of the injection chamber defines a groove, the mold defines an injection port on a side wall thereof, the injection port and the injection chamber are communicated. Referring to FIG. 8, the mold 800 includes an upper mold core 810, a lower mold core 830, and an annular cavity wall 850. The upper mold core 810 and the lower mold core 830 are located on two side of the annular cavity wall 850, respectively, such that the upper mold core 810, the lower mold core 830 and the annular cavity wall 850 cooperatively form the injection chamber, the shape of the injection chamber is adapted to that of the glass substrate 110, an inner side of the injection chamber defines a groove corresponding to the surface of the glass substrate 110. The annular cavity wall 850 defines an injection port 852 communicating with the injection chamber.

Step S313b, a molten glass is injected to the injection chamber via the injection port, and then cooled to obtain the glass substrate. The molten glass can be injected to the injection chamber via the injection port 852, and then cooled to obtain an integrally molded glass substrate 110 which defines the meshed groove 112. In the illustrated embodiment, the glass substrate is made of organic material, such as polymethyl methacrylate, polycarbonate and the like.

Step S320, a layer of silicon dioxide is coated on the surface of the glass substrate defining the groove. The layer of silicon dioxide is coated on the surface of the glass substrate 110 defining the groove 112, and a silicon dioxide layer 130 is formed on the surface of the glass substrate 110 defining the groove 112.

Step S330, a conductive ink is printed on the surface of the glass substrate having a silicon dioxide layer, the conductive ink is received in the groove. In the illustrated embodiment, the conductive ink is silver bromide solution, which contains silver bromide particles. In alternative embodiments, the conductive ink can contain particle selected from the group consisting of particles corresponding to other metal, conductive polymer particle, graphene particle, carbon nanotubes, and indium tin oxide particle. The conductive ink is printed on the surface of the glass substrate 110 having a silicon dioxide layer 130, the conductive ink is received in the groove 112.

Step S340, the conductive ink is cured to form a conductive mesh line on the surface of the glass substrate, and the conductive glass substrate is obtained. The conductive ink is cured, and the conductive mesh line 150 is formed in the groove 112, the conductive mesh line 150 is deposited in the groove 112 and attached to the glass substrate 110 via the silicon dioxide layer 130. The silicon dioxide layer 130 can increase the adhesive force between the conductive mesh line 150 and the glass substrate 110, ensure that the conductive mesh line 150 is not easily shed off the glass substrate 110.

In order further increase the adhesive force between the conductive mesh line 150 and the glass substrate 110, the conductive ink further contains glass powder, such that the finally prepared conductive mesh line 150 contains glass powder.

In the method of preparing the conductive glass substrate, the process is relatively simple, thus saving manpower and resources, reducing production cost. And it is not necessary to use a flexible substrate as a supporting body for the conductive glass substrate prepared by the method, the cost is further reduced.

It should be understood that the descriptions of the examples are specific and detailed, but those descriptions can't be used to limit the present disclosure. Therefore, the scope of protective of the invention patent should be subject to the appended claims.

What is claimed is:

1. A conductive glass substrate, comprising:
   a glass substrate, which defines a meshed groove on a surface thereof;
   a silicon dioxide layer attached to the surface of the glass substrate defining the groove; and
   a conductive mesh line, which is adapted to the shape of the groove, the conductive mesh line being deposited in the groove, and attached to the glass substrate via the silicon dioxide layer.

2. The conductive glass substrate according to claim 1, wherein the conductive mesh line is made of at least one material selected from the group consisting of metal, conductive polymer, graphene, carbon nanotubes, and indium tin oxide.

3. The conductive glass substrate according to claim 2, wherein the material of the conductive mesh line further comprises glass powder.

* * * * *